US005500988A

United States Patent [19]

Moynihan et al.

[11] Patent Number: 5,500,988

[45] Date of Patent: Mar. 26, 1996

[54] METHOD OF MAKING A PEROVSKITE THIN-FILM INK JET TRANSDUCER

[75] Inventors: Edward R. Moynihan, Plainfield, N.H.; Paul A. Hoisington, Norwich, Vt.; David W. Gailus, Merrimack, N.H.

[73] Assignee: Spectra, Inc., Hanover, N.H.

[21] Appl. No.: 258,709

[22] Filed: Jun. 13, 1994

Related U.S. Application Data

[60] Continuation-in-part of Ser. No. 89,310, Jul. 9, 1993, Pat. No. 5,446,484, which is a division of Ser. No. 615,893, Nov. 20, 1990, Pat. No. 5,265,315.

[51] Int. Cl.[6] .................................................. H01L 41/22

[52] U.S. Cl. ........................ 29/25.35; 29/890.1; 427/100; 347/68

[58] Field of Search ................................ 29/25.35, 890.1; 427/100; 310/800, 365, 366; 347/68; 346/140.1

[56] References Cited

U.S. PATENT DOCUMENTS

| | | |
|---|---|---|
| 4,584,590 | 4/1986 | Fischbeck . |
| 4,680,595 | 7/1987 | Cruz-Uribe . |
| 5,202,703 | 4/1993 | Hoisington . |
| 5,265,315 | 11/1993 | Hoisington . |

OTHER PUBLICATIONS

Yi et al., "Preparation of $Pb(Zr,Ti)O_3$ thin films by sol gel processing: Electrical, optical, and electro-optic properties", *Journal of Applied Physics*, vol. 64, No. 5, pp. 2717–2724 (Sep. 1, 1988).

Zaghete et al., "Phase Characterization of Lead Zirconate Titanate Obtained from Organic Solutions of Citrates", *Journal of the American Ceramic Society*, vol. 75, No. 8, pp. 2088–2093 (Aug. 1992).

*Primary Examiner*—Carl E. Hall
*Attorney, Agent, or Firm*—Brumbaugh, Graves, Donohue & Raymond

[57] ABSTRACT

In the particular embodiments described in the specification, a thin-film PZT piezoelectric transducer ink jet head is prepared by oxidizing one surface of a silicon wafer to provide a dielectric layer, forming electrodes on the layer by photoresist processing techniques, depositing one or more layers of perovskite-seeded PZT material to provide a thin-film piezoelectric layer having a thickness in the range of 1–25 microns, forming another pattern of electrodes on the surface of the PZT layer by photoresist techniques, and selectively etching the silicon substrate in the region of the electrodes to provide an ink chamber. Thereafter, an orifice plate is affixed to the substrate to enclose the ink chambers and provide an ink orifice for each of the chambers. An ink jet head having chambers 3.34 mm long by 0.17 mm wide by 0.15 mm deep and orifices spaced by 0.305 mm is provided.

21 Claims, 3 Drawing Sheets

METHOD OF MAKING A PEROVSKITE THIN-FILM INK JET TRANSDUCER

REFERENCE TO RELATED APPLICATIONS

This application is a continuation-in-part of the Hoisington et al. application Ser. No. 08/089,310, filed Jul. 9, 1993, now U.S. Pat. No. 5,446,484, which is a division of application Ser. No. 07/615,893, filed Nov. 20, 1990, now U.S. Pat. No. 5,265,315.

BACKGROUND OF THE INVENTION

This invention relates to piezoelectric transducers for ink jet heads and, more particularly, to lead-zirconium-titanate (PZT) thin-film transducers having a perovskite crystal structure.

In the Hoisington et al. U.S. Pat. No. 5,265,315, the disclosure of which is incorporated herein by reference, the preparation of thin-film piezoelectric transducers for ink jet heads used in ink jet systems is described. In the preparation of such transducers, one or more electrodes are formed on a substrate and a thin film of PZT piezoelectric material is applied to the electroded substrate by a sol gel process of the type described, for example, in the publication entitled "Preparation of $Pb(Zr,Ti)O_3$ Thin Films by Sol Gel Processing: Electrical, Optical, and Electro-Optic Properties" by Yi, Wu and Sayer in the *Journal of Applied Physics,* Vol. 64, No. 5, Sept. 1, 1988, pp. 2717–2724. As described in the Hoisington et al. patent, the thickness of a PZT thin-film transducer should be the minimum necessary to withstand stresses applied to the film during ink jet operation and, for ink jet systems having orifice and ink chamber sizes in the general range described hereinafter using inks having operating viscosities in the range of about 1–40 cps, the PZT film should have a thickness in the range of about 1–25 microns. If the film thickness is greater than a few microns, it is preferably deposited in several layers to avoid cracking and to assure a small perovskite grain size.

It has been found, however, that the piezoelectric performance of PZT films deposited in this manner can be degraded by the tendency of the preferred perovskite form of PZT to nucleate in a nonuniform manner at the film surfaces or to be pre-empted by nucleation and growth of a nonpiezoelectric "pyrochlore" phase. Consequently, with patterned electrodes applied to the surfaces of the PZT film, there are variations in the piezoelectric properties in the regions adjacent to the electrodes, producing performance variations. Furthermore, the processing temperature required to initiate nucleation in the region adjacent to an electrode is highly dependent upon the choice of the electrode material and also tends to be higher than a temperature which is desirable to minimize loss and migration of lead from the PZT film.

SUMMARY OF THE INVENTION

Accordingly, it is an object of the present invention to provide a perovskite thin-film PZT ink jet transducer which overcomes the disadvantages of the prior art.

Another object of the invention is to provide an ink jet head containing a perovskite thin-film PZT ink jet transducer having patterned electrodes which provides improved performance characteristics.

These and other objects of the invention are attained by depositing a PZT film which is uniformly seeded with a small concentration of perovskite PZT particles on a substrate and firing the film at a temperature appropriate for preferential perovskite growth. The perovskite seed particles should be small relative to the thickness of the layer of PZT material being deposited and, where PZT films having a thickness greater than about 1 micron are to be formed, the films are preferably produced by depositing successive layers of PZT material having a maximum thickness of about 1 micron. Thus, the seed particles distributed in each of the layers of PZT material should be small relative to the thickness of the layer being deposited. For example, a one-micron-thick layer should have seed particles of less than 0.5 microns, and preferably less than 0.2 microns, and the concentration of the seed particles in the deposited layer of PZT material should be within the range from about 0.1% to 10%, based on the PZT content of the deposited layer, smaller concentrations being required for smaller seed particle sizes.

Preferably, an electrode pattern is applied to the substrate on which the PZT film is being formed prior to deposition of the PZT material and, after the PZT film has been formed, another electrode pattern may be provided on the opposite surface of the film.

In one embodiment, a 4-micron-thick perovskite PZT film transducer has a pattern of electrodes on one surface and is formed from eight successive layers of PZT material 0.5 microns thick, each containing a 0.8% concentration of seed particles having an average size of 0.1 micron.

Desirably, the substrate on which the perovskite PZT film is deposited is an etchable material, and a portion of the substrate is removed by etching to produce an ink jet chamber for which the electroded perovskite-seeded PZT piezoelectric thin-film material forms one wall portion. In a preferred embodiment, an array of adjacent ink jet chambers is formed in a semiconductor substrate which also contains integrated-circuit components and the thin film of perovskite-seeded PZT piezoelectric material provides the transducers for all of the ink jet chambers, an orifice plate being affixed to the opposite side of the substrate to provide an orifice for each ink jet chamber.

Preferably, the etchable substrate is a silicon substrate of the type used in preparing integrated-circuit chips, and the circuitry and components used to actuate the piezoelectric elements, such as drive pulse switches and memory elements, are formed on the surface of the substrate in accordance with the usual semiconductor integrated-circuit processing techniques. Similarly, the electrodes for both sides of the thin-film perovskite-seeded PZT piezoelectric layer are preferably applied in accordance with semi-conductor integrated-circuit technology using, for example, a photoresist material to define the electrode patterns for opposite surfaces of the transducer prior to and after deposition of the thin-film piezoelectric material. In order to create a desirable small, uniform grain structure in the perovskite-seeded PZT piezoelectric layer, the film is preferably fired and annealed with a rapid thermal annealing technique.

BRIEF DESCRIPTION OF THE DRAWINGS

Further objects and advantages of the invention will be apparent from a reading of the following description in conjunction with the accompanying drawings, in which.

DESCRIPTION OF PREFERRED EMBODIMENTS

Figure 1:
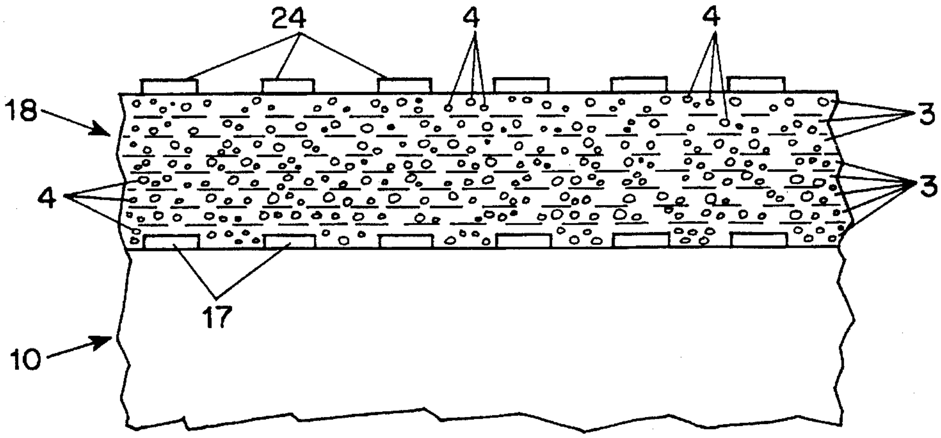
FIG. 1 is a schematic fragmentary view showing a representative embodiment of the invention in which a thin-film piezoelectric transducer consists of successive layers of perovskite-seeded PZT material.

In the representative embodiment of the invention shown in schematic form in FIG. 1, a thin-film piezoelectric transducer 18 is formed on an electroded substrate 10 having a pattern of electrodes 17 by successive deposition of a series of layers 3 of PZT material, each containing a substantially uniform dispersion of perovskite PZT seed particles 4.

Each PZT layer 3 is successively applied to the electroded substrate 10 by the sol gel process described, for example, in the publication entitled "Preparation of Pb(Zr,Ti)$O_3$ Thin Films by Sol Gel Processing: Electrical, Optical, and Electro-Optic Properties" by Yi, Wu and Sayer in the *Journal of Applied Physics,* Vol. 64, No. 5, Sept. 1, 1988, pp. 2717–2724.

After firing to drive off organic materials, the deposited PZT layer is then annealed by heating to 600° C. to 800° C. to allow grain growth. Preferably, rapid thermal annealing is used to reduce the cycle time and to assure a small, uniform perovskite grain structure necessary for good mechanical performance. This may be accomplished by heating the coated substrate at a rate of about 100° C. per second to approximately 600° C. to 800° C. and maintaining it at the annealing temperature for about 10 seconds, after which the coated substrate is cooled to room temperature in about 30 seconds by inert gas circulation. This provides a uniform, small PZT perovskite grain size of about 0.3 microns.

While the PZT film strength increases with increasing thickness, i.e., with increasing number of layers, the magnitude of the PZT bending in response to a given applied voltage decreases with increasing thickness. Accordingly, the total film thickness should be the minimum necessary to withstand the stresses applied to the PZT film during ink jet operation. For ink jet systems having orifice and ink chamber sizes in the general range described hereinafter, and using inks having operating viscosities in the range of about 1–40 cps, the PZT film should have a thickness in the range of about 1–25 microns, preferably about 2–10 microns, and, desirably, about 3–5 microns. If the film thickness is greater than a few microns, the film is preferably prepared by depositing it in several layers, each from 0.1 to 5 microns thick depending on the sol-gel solution used, to avoid cracking of the film and to assure a small perovskite grain size.

After the application of a sufficient number of successive layers of PZT material to provide the required PZT film thickness, another pattern of electrodes 24 is applied to the top surface of the thin-film perovskite PZT piezoelectric transducer in the manner described hereinafter.

In the embodiment of the invention illustrated in FIG. 1, a 4 μm PZT perovskite film 18 contains eight 0.5 μm-thick layers 3 of PZT material, each seeded with a distribution of perovskite PZT seed particles 4 about 0.1 μm in size at a concentration of about 1%. The seed particle size should be small relative to the layer thickness, and smaller particle sizes do not require as high a concentration as larger particles. For example, in a PZT layer 0.5 μm thick, a 0.8% concentration of 0.1 μm particles provides the same seeding effect as a 6.4% concentration of 0.2 μm seed particles.

The PZT layers 3 are preferably no more than 1 μm thick, and desirably about 0.5 μm thick, and the perovskite seed particle size should be less than half the thickness of the layer and have a substantially uniform size distribution. Small seed particle sizes with a correspondingly low concentration are preferred, even with layers of up to 1 μm thick.

A typical process for preparing an ink jet head having ink chambers with the above-described thin-film PZT piezoelectric transducer in accordance with the invention is illustrated in FIGS. 2(*a*)–2(*f*). In FIG. 2(*a*), an etchable semiconductor substrate 10, such as an N-type silicon substrate wafer with a [1,1,0] crystal orientation having a thickness of about 6 mils (150 microns) is first oxidized in steam at 1000° C. in the usual manner to form a 2500Å-thick silicon oxide layer 11 which will act as a dielectric and an etch barrier. For use as an ink chamber plate in a hot melt ink jet head, silicon provides desirable mechanical, electrical and thermal properties and is a highly suitable substrate for thin-film deposition and photoresist processes. It also permits the incorporation of suitable system control components on the same substrate by integrated-circuit techniques, as described hereinafter. To enable etching of the substrate, a [1,1,0] crystal orientation is desirable.

Thereafter, a layer 12 of conductive material about 0.2 micron thick is applied to the silicon oxide layer. The conductive layer 12 may be a sputtered or a vacuum-evaporated aluminum, nickel, chromium or platinum layer or an indium tin oxide (ITO) layer deposited by a conventional sol gel process.

As shown in FIG. 2(*b*), a conventional photoresist layer 13, spin-coated on the conductive layer 12, is exposed by ultraviolet rays 14 through a mask 15 and developed to harden the resist layer 12 in selected regions 16 in accordance with the electrode pattern which is to be provided on one side of the thin-film PZT piezoelectric layer. The unhardened photoresist is removed, the exposed metal layer 12 is etched in the usual manner, and the photoresist is stripped off, leaving a pattern of conductive electrodes 17 on the layer 11, as shown in FIG. 2(*c*). Thereafter, the PZT film 18 is applied in the manner described above.

The PZT film 18 is then coated with another layer 19 of conductive material, such as aluminum, nickel, chromium, platinum or ITO, and, as illustrated in FIG. 2(*d*), a photoresist layer 20 is coated on the conductive layer and then exposed to ultraviolet rays 21 through a mask 22 and developed to produce hardened regions 23. Thereafter, the unhardened photoresist is removed and the exposed portion of the conductive layer 19 is etched to provide a pattern of electrodes on the upper side of the PZT film 18 corresponding to the hardened regions 23. The resulting upper pattern of electrodes 24 is shown in FIG. 2(*e*). Following formation of the electrodes 24, a protective layer 25 of polyimide material is spin-coated on the top surface of the PZT layer to protect that layer and the electrode pattern.

In certain transducer arrangements with interdigitated electrodes, as described in the Hoisington et al. U.S. Pat. No. 5,202,703, the disclosure of which is incorporated herein by reference, electrodes are required on only one surface of the piezoelectric film. In such cases, the step of forming electrode patterns on one side of the PZT film may be eliminated.

In order to produce the ink chambers which are to be acted upon by the PZT thin-film layer, the opposite side of the silicon substrate 10 is coated with a photoresist layer 26 and exposed to ultraviolet light rays 27 through a mask 28 and developed to provide a pattern of hardened photoresist regions 29. The unhardened photoresist is then removed and the exposed silicon is etched down to the silicon oxide layer 11 to produce a pattern of ink chamber cavities 30, as shown in FIG. 2(*f*).

After the ink chambers 30 have been formed, the polyimide coating 25 on the top surface is removed by etching at locations where electrical contacts are to be made to the top electrodes, and both the polyimide layer and the PZT film are etched away in locations where contacts to the bottom electrodes are desired. Gold is then sputtered through a mask onto these locations so that wire bonds or pressure contacts may be used for electrical connections, and an orifice plate is bonded to the lower surface of the substrate 10 to close the ink chambers and provide an orifice for each chamber in the usual manner. By appropriate energization of the electrodes 17 and 24, the thin-film piezoelectric transducer layer 18 may be selectively deformed in each chamber 30 in the usual manner so as to eject ink from the chamber through the corresponding orifice.

Figure 3:
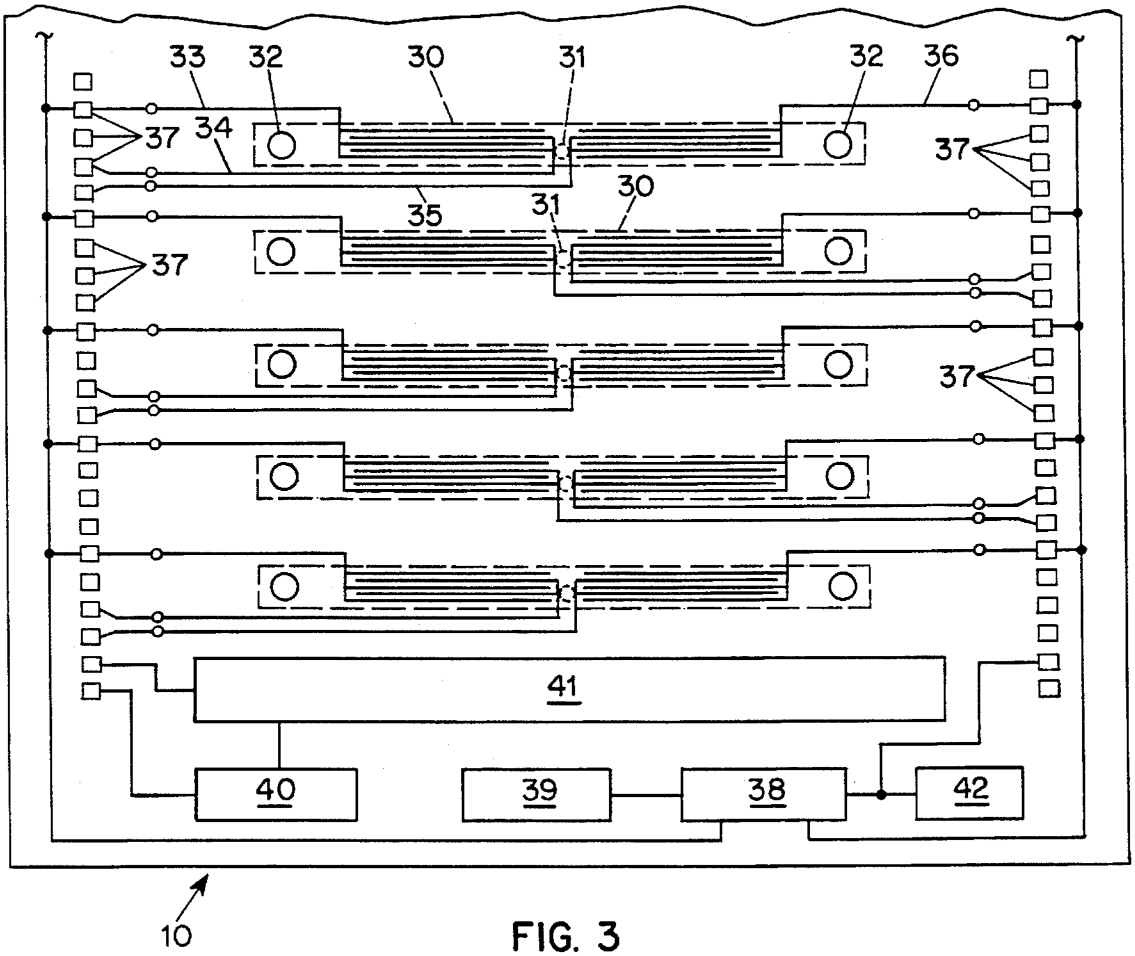
FIG. 3 is a schematic diagram showing a representative circuit arrangement for controlling the operation of an ink jet head and containing electrodes formed on one surface of a semiconductor substrate for a thin-film piezoelectric transducer.
Figure 2A:
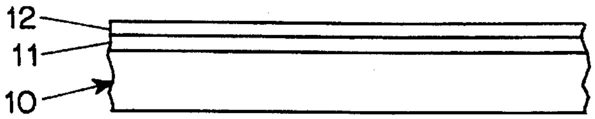
FIGS. 2(*a*)–2(*f*) are schematic cross-sectional illustrations showing the successive stages in a typical process for preparing a thin-film piezoelectric transducer and ink jet chamber in accordance with one embodiment of the present invention.
Figure 2B:
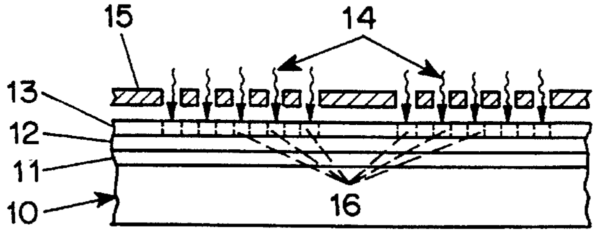
Figure 2C:
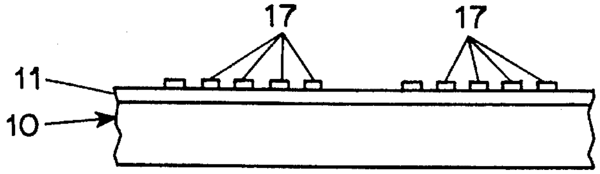
Figure 2D:
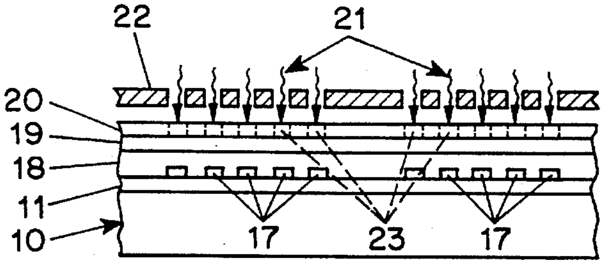
Figure 2E:
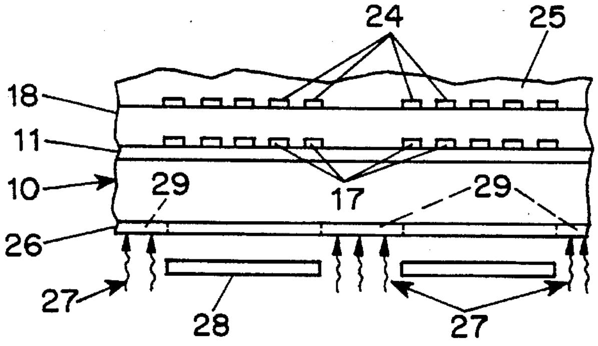
Figure 2F:
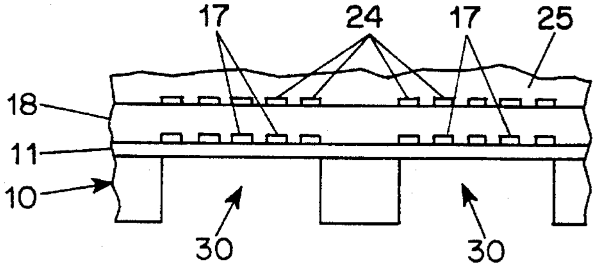

FIG. 3 illustrates schematically a representative conductor pattern applied to the upper surface of a coated substrate to energize the electrodes 24 in the patterns opposite each of the ink chambers 30. In the top plan view shown in FIG. 3, the elongated shape of each of the ink chambers 30 in the underlying substrate is illustrated in dotted outline as are the orifices 31, which are centrally positioned with respect to each ink chamber, and two ink supply apertures 32, one at each end of each ink chamber, which are connected to an ink supply (not shown).

In the schematic representation of a typical embodiment shown in FIG. 3, selected electrodes 24 are connected through corresponding conductors 33, 34, 35 and 36 to appropriate contact regions 37 aligned adjacent to the edges of the substrate 10 and exposed to permit bonding of wires or engagement by pressure contacts. A corresponding conductor pattern is provided beneath the PZT layer to supply potential to the underlying electrodes 17 (which are not illustrated in FIG. 3) from appropriate contact regions 37.

If the substrate 10 is a silicon wafer of the type used in semiconductor processing, various ink jet system control components may be provided on the same substrate using conventional semiconductor integrated-circuit processing technology. Such components may include a transducer drive unit 38 containing conventional switches and other electronic components required to supply the appropriate electrical pulses to actuate the transducer elements, a nonvolatile memory unit 39 containing semiconductor storage elements employing PZT ferroelectric capacitors to store information relating, for example, to calibration of the ink jet head to provide appropriate firing times and pulse amplitudes for the ink jet system in which it is used, a temperature-sensing and control unit 40 and a related thin-film heating element 41 to detect and maintain the correct temperature for proper operation of the ink jet head, and a drop counter 42 to count drops of each type of ink ejected by the ink jet head and provide a warning or shut-off signal when an ink supply is nearly depleted.

In a typical ink jet system utilizing perovskite-seeded thin-film piezoelectric transducers of the type described herein, a single silicon substrate may be provided with a piezoelectric transducer having uniform perovskite response characteristics, which is formed with a series of adjacent ink chambers approximately 3.34 mm long, 0.17 mm wide and 0.15 mm deep and spaced by about 0.13 mm so as to provide a spacing between adjacent orifices of about 0.3 mm. With this arrangement, a 300 line per inch (11.8 line per mm) image can be obtained by orienting the angle of the aligned orifices at 33.7° to the scan direction. Moreover, a silicon substrate containing 48 ink jets with associated drivers, memory and temperature-control circuitry can be provided on a single chip measuring about 10 mm by 15 mm.

Figure 4:
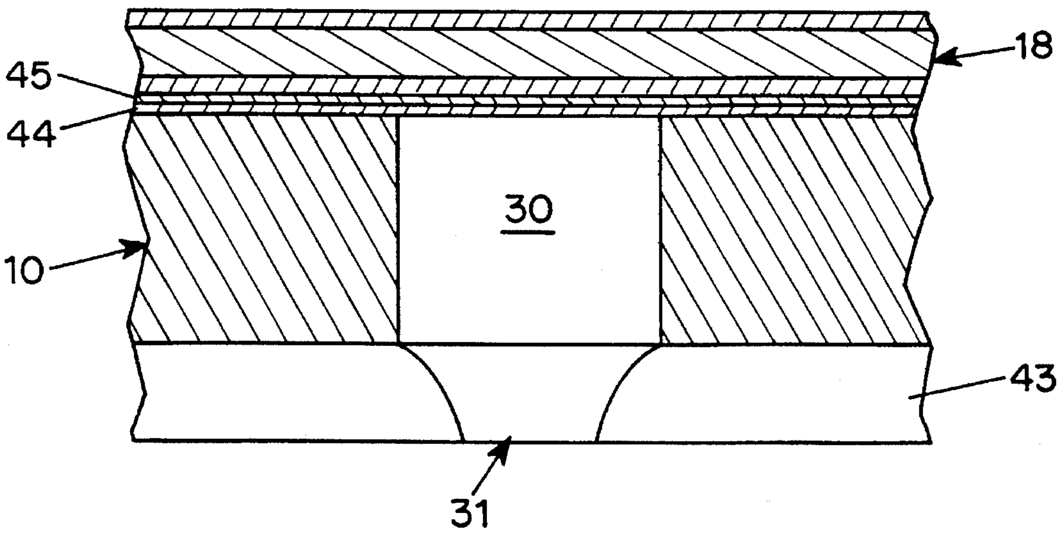
FIG. 4 is an enlarged cross-sectional view showing an ink jet chamber with a thin-film piezoelectric transducer in accordance with another embodiment of the invention.

In an alternative structure illustrated in the enlarged view of FIG. 4, a silicon substrate 10 having an orifice plate 43 affixed to the lower surface to provide an orifice 31 for each chamber 30 is coated on the upper surface with a thin metal barrier layer 44 of platinum, nickel or the like about 0.2 microns thick, and a dielectric layer 45 of aluminum oxide, also about 0.2 microns thick, is applied over the metal barrier layer. Thereafter, the electrode patterns and the PZT film 18 are applied in the manner described above with respect to FIGS. 1 and 2(*a*)–2(*f*). With this arrangement, the PZT film is effectively protected from attack by constituents of the ink contained in the chamber 30.

Moreover, the thin-film piezoelectric transducer described herein need not be combined with a silicon substrate which is etched to form the ink chambers. Instead, if desired, after the perovskite-seeded thin-film transducer and associated electrodes have been prepared in the manner described herein, the upper surface of the assembly may be affixed to another substrate having the desired ink chamber pattern, and the silicon substrate may be etched away. With this arrangement, the perovskite-seeded thin-film PZT may be further protected by an optional intervening membrane or other flexible support member interposed between the PZT film and the new substrate containing the ink chambers. In addition, if the silicon substrate is removed entirely, two perovskite-seeded thin-film PZT transducers may be mounted on opposite sides of a membrane, which is then mounted on another substrate containing the desired ink jet chamber pattern, thereby increasing the transducer displacement available for a given applied voltage. As another alternative, multiple layers of perovskite-seeded thin-film PZT transducer and associated electrode patterns may be formed in succession on the same substrate to produce increased ejection pressure of the transducer for a given applied voltage.

Although the invention has been described herein with reference to specific embodiments, many modifications and variations therein will readily occur to those skilled in the art. Accordingly, all such variations and modifications are included within the intended scope of the invention.

We claim:

1. A method for making an ink jet transducer comprising providing a substrate, depositing at least one perovskite-seeded PZT layer on the substrate, and firing the PZT layer to form a piezoelectric, polycrystalline perovskite PZT film having a thickness between about 1 and about 25 microns, and forming at least one electrode pattern adjacent to a surface of the piezoelectric film to provide a transducer element.

2. A method according to claim 1 wherein the perovskite-seeded PZT layer is seeded with perovskite particles having a size less than 0.5 microns and a concentration from 0.1% to 10%.

3. A method according to claim 1 including annealing the PZT film after deposition on the substrate.

4. A method according to claim 1 wherein the polycrystalline perovskite PZT piezoelectric film is formed by depositing at least two successive perovskite-seeded layers of PZT material on the substrate.

5. A method according to claim 4 wherein each successive perovskite-seeded PZT layer has a thickness of no more than about 1 micron and wherein the perovskite particles used to seed the layers have a size no greater than about 0.5 micron.

6. A method according to claim 4 wherein each successive perovskite-seeded PZT layer has a thickness of no more than about 0.5 micron and wherein the perovskite particles used to seed the layers have a size no greater than about 0.2 micron.

7. A method according to claim 1 wherein the thickness of the piezoelectric film is in the range from about 2 to about 10 microns.

8. A method according to claim 1 wherein the thickness of the piezoelectric film is in the range from about 3 to about 5 microns.

9. A method according to claim 1 including the step of forming at least one electrode adjacent to the other surface of the piezoelectric film.

10. A method according to claim 1 including separating the transducer element from the substrate and applying the transducer element to a membrane.

11. A method according to claim 1 including applying the transducer element to a second substrate and removing at least a part of the substrate on which the transducer element was formed.

12. A method according to claim 1 including the step of removing a portion of the substrate to provide a chamber adjacent to a region of the transducer element containing at least one electrode.

13. A method according to claim 12 including the step of affixing an orifice plate to the side of the substrate opposite the transducer element to enclose the chamber and provide an orifice communicating with the chamber.

14. A method according to claim 1 wherein the substrate is capable of solid state circuitry fabrication.

15. A method according to claim 14 including forming a transducer drive circuit for the ink jet head on the substrate.

16. A method according to claim 14 including forming a memory circuit employing PZT ferroelectric components for the ink jet head on the substrate.

17. A method according to claim 14 including forming a temperature control element for the ink jet head on the substrate.

18. A method according to claim 14 including forming a thin-film heater for the ink jet head on the substrate.

19. A method according to claim 14 including forming a drop ejection pulse control element for the ink jet head on the substrate.

20. A method according to claim 14 including forming a drop counter circuit for ink supply detection on the substrate.

21. A method according to claim 14 wherein the substrate is silicon.

* * * * *